US006901099B1

(12) United States Patent
Wasserbauer

(10) Patent No.: US 6,901,099 B1
(45) Date of Patent: May 31, 2005

(54) ANTIGUIDE SINGLE MODE VERTICAL CAVITY LASER

(75) Inventor: John G. Wasserbauer, Erie, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 74 days.

(21) Appl. No.: 10/186,779

(22) Filed: Jul. 1, 2002

Related U.S. Application Data

(60) Provisional application No. 60/302,253, filed on Jun. 29, 2001.

(51) Int. Cl.[7] .............................. H01S 5/00; H01S 3/08
(52) U.S. Cl. .............................. 372/46; 372/45; 372/96; 372/99
(58) Field of Search .............................. 372/45–46, 96, 372/99, 50; 257/79; 359/344

(56) References Cited

U.S. PATENT DOCUMENTS

| | | | | |
|---|---|---|---|---|
| 5,159,604 A | * | 10/1992 | Mehuys et al. | 372/50 |
| 5,438,585 A | * | 8/1995 | Armour et al. | 372/45 |
| 5,446,752 A | * | 8/1995 | Ackley et al. | 372/46 |
| 5,606,570 A | * | 2/1997 | Botez et al. | 372/50 |
| 5,903,590 A | * | 5/1999 | Hadley et al. | 372/96 |
| 6,160,830 A | * | 12/2000 | Kiely et al. | 372/46 |
| 6,160,834 A | * | 12/2000 | Scott | 372/96 |
| 6,167,073 A | * | 12/2000 | Botez et al. | 372/46 |
| 6,169,756 B1 | * | 1/2001 | Chirovsky et al. | 372/46 |
| 6,320,893 B1 | * | 11/2001 | Ueki | 372/96 |
| 6,396,865 B1 | * | 5/2002 | Mawst et al. | 372/96 |
| 6,411,638 B1 | * | 6/2002 | Johnson et al. | 372/46 |
| 6,445,495 B1 | * | 9/2002 | Walker et al. | 359/344 |
| 6,515,305 B2 | * | 2/2003 | Gopinath | 257/79 |
| 6,542,527 B1 | * | 4/2003 | Gopinath | 372/45 |
| 6,542,531 B2 | * | 4/2003 | Sirbu et al. | 372/46 |
| 6,608,849 B2 | * | 8/2003 | Mawst et al. | 372/43 |
| 6,618,414 B1 | * | 9/2003 | Wasserbauer et al. | 372/46 |
| 6,751,245 B1 | * | 6/2004 | Wasserbauer et al. | 372/46 |
| 6,795,478 B2 | * | 9/2004 | Hwang et al. | 372/96 |

* cited by examiner

Primary Examiner—Minsun Oh Harvey
Assistant Examiner—James Menefee
(74) Attorney, Agent, or Firm—Barlow, Josephs & Holmes, Ltd.

(57) ABSTRACT

A vertical cavity laser (VCL) including a first mirror formed adjacent a substrate, an optical cavity formed adjacent the first mirror, a second mirror formed adjacent the optical cavity, a first current and/or optical aperture formed within the cavity, within the mirror or at the surface of the mirror, and an antiguide for reducing, balancing, or reversing the index step created by the first current and/or optical aperture. The VCL may further include a second optical aperture for confining the optical mode to provide single mode operation.

23 Claims, 11 Drawing Sheets

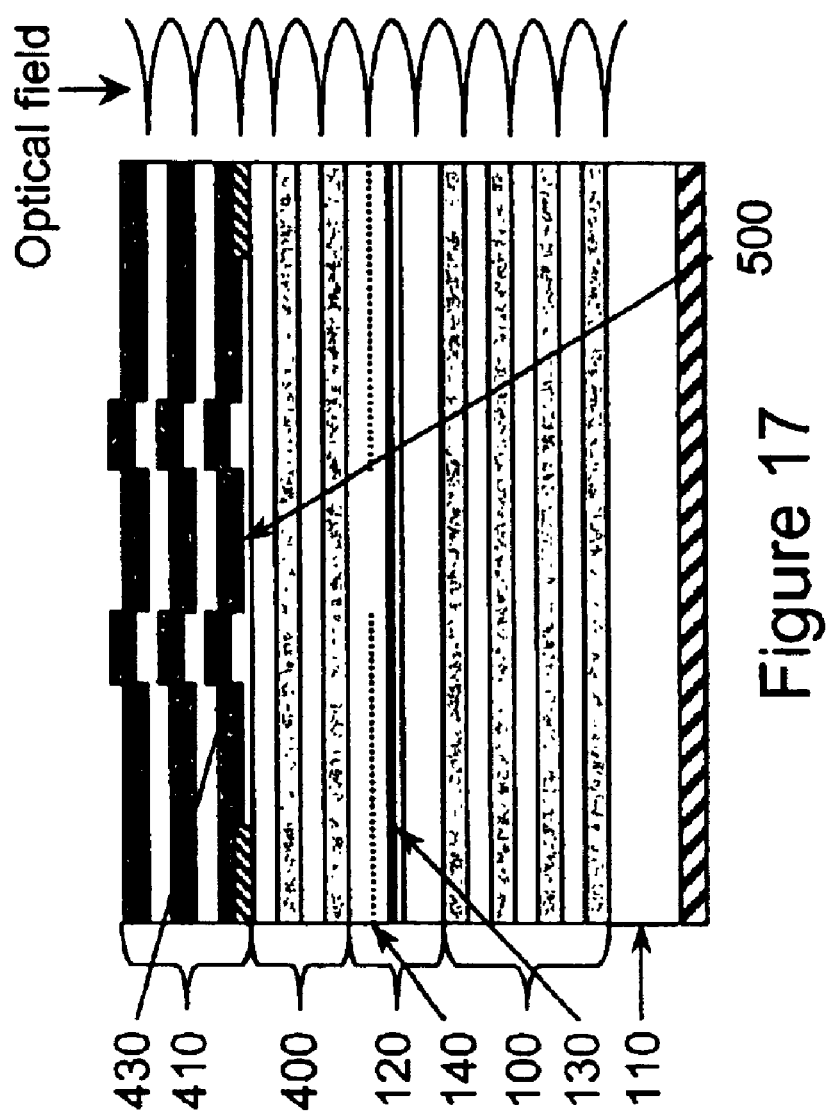

ANTIGUIDE SINGLE MODE VERTICAL CAVITY LASER

CROSS-REFERENCE TO RELATED APPLICATION

This application claims priority to U.S. Provisional Patent application Ser. No. 60/302,253, entitled ANTIGUIDE SINGLE MODE VERTICAL CAVITY LASER" filed on Jun. 29, 2001 the content of which is incorporated herein by reference.

FIELD OF THE INVENTION

This invention generally relates to optical communication systems and more particularly relates to single mode optical transmitters.

BACKGROUND

Vertical-cavity lasers (VCLs) are becoming increasingly important for a wide variety of applications including optical interconnection of integrated circuits, optical computing systems, optical recording and readout systems, and telecommunications. Further, VCLs emit a generally circular beam that is well suited for coupling to optical fibers. Single mode VCLs have additional advantages in terms of high-speed data transmission due to the well-behaved properties of the single optical mode.

Many approaches for controlling the transverse mode structure have been developed in recent years. Methods of mode control fall into two general categories, gain/loss modulation and index modulation. In the first category, the imaginary part of the refractive index is tailored laterally so as to provide more gain or less loss for the fundamental mode with respect to higher order modes. An example of gain modulation is the use of a current constriction element, such as an oxide or implant aperture, to preferentially pump the fundamental mode.

Similarly, there are a variety of methods that may be used to provide loss modulation. For example, a contoured mirror may be used to increase reflectivity for the fundamental mode or decrease reflectivity for higher order modes. Alternatively anti-phasing of a mirror may be used to increase transmission losses for higher order modes to provide selective loss modulation. Further, the optical cavity may be extended to increase diffraction losses for higher order modes, or selective mirror doping may be used to increase absorption losses for higher order modes.

Index modulation techniques, by contrast, generally tailor the real part of the refractive index laterally so as to form a waveguide. Methods of index modulation include lateral regrowth of lower index material, oxide apertures, and effective index guiding via resonant cavity wavelength modulation. The waveguide in the index modulation methods typically requires a region of higher index surrounded by a region of lower index. The relative index step determines the radius of the waveguide for single mode operation via $$r = \frac{2.405\lambda}{2\pi\sqrt{n_1^2 - n_2^2}}, \quad \text{(Eq. 1)}$$

where $\lambda$ is the lasing wavelength and $n_1$ and $n_2$ are the effective indexes of refraction in the core and cladding regions, respectively. As seen from the equation the greater the index step between the effective indices of refraction, the smaller the single mode cutoff radius.

The conventional oxide aperture transverse mode control method entails a relative high index step and therefore requires a relatively small electrical and optical aperture to achieve single mode operation. In operation the thermal impedance, voltage, resistance and operating current density all increase with decreasing aperture diameter. In addition, the diffraction loss from an intra-cavity or surface aperture (whichever is present) and the divergence angle also increase with decreasing aperture resulting in a corresponding decrease in output power.

To date only extended cavity designs have been proposed to increase the aperture diameter of single mode devices. However, extended cavity designs may allow additional longitudinal modes to lase thereby limiting the single mode range of operation. In addition, extending the optical cavity tends to reduce the photon density in the longitudinal direction, thus reducing the achievable modulation bandwidth.

In addition to small device size, one other problem plagues vertical cavity lasers. VCLs may be subject to thermal lensing created by the local heating of the gain region due to electrical power dissipation. The attendant rise in junction temperature raises the index of the material in the core region and provides additional optical index guiding. The additional index step, on the order of 0.015 to 0.025, may be sufficient to cause multimode operation. As a result, the electrical and/or optical apertures must be constricted further, or the loss modulation increased, to maintain single mode operation.

SUMMARY OF THE INVENTION

An exemplary embodiment of the present invention provides a vertical cavity laser that emits a single optical mode having larger electrical and optical apertures. The larger electrical and optical apertures reduce the thermal impedance, voltage and resistance of the device. In addition, the larger aperture may also reduce the operating current density as well the diffraction loss from the intracavity or surface aperture (whichever is present) of the device. The larger electrical and optical apertures may also reduce the divergence angle and increase the output power of the device.

In one aspect of the present invention a VCL may include a first mirror formed adjacent a substrate, an optical cavity formed adjacent the first mirror, a second mirror formed adjacent the optical cavity, a first current and/or optical aperture formed within the cavity, within the mirror or at the surface of the mirror, and an antiguide for reducing, balancing, or reversing the index step created by the first current and/or optical aperture. The VCL may further include a second optical aperture for confining the optical mode to provide single mode operation.

BRIEF DESCRIPTION OF THE DRAWINGS

These and other features, aspects, and advantages of the present invention will become better understood with regard to the following description, appended claims, and accompanying drawings where:

FIG. 17 is a cross-sectional view of a vertical cavity laser with a hybrid semiconductor/dielectric mirror having an intra-mirror perturbation, formed within the dielectric portion of the mirror, which forms an antiguide that balances or reverses an index step formed by an oxide aperture in the optical cavity and a second intra-mirror perturbation, also formed within the dielectric portion of the mirror, which circumscribes the first that forms an optical aperture to confine the optical mode in accordance with an exemplary embodiment of the present invention.

DETAILED DESCRIPTION OF THE INVENTION

In an exemplary embodiment of the present invention a VCL may include an effective index guide to reduce or eliminate the lateral index step created by a current constriction. The described exemplary embodiment laterally expands the optical mode allowing for a larger aperture diameter single mode VCL.

Figure 1A:
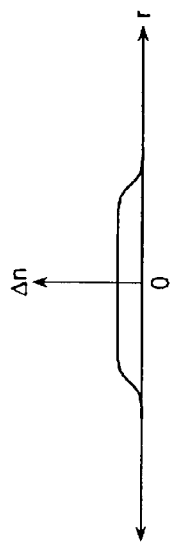
FIGS. 1(a–d) graphically illustrate the lateral index profiles of a vertical cavity laser having various current and/or optical confinement schemes: a) thermal lens (above threshold), b) abrupt oxide (below threshold), c) tapered oxide (below threshold), d) effective index (below threshold)
Figure 1B:
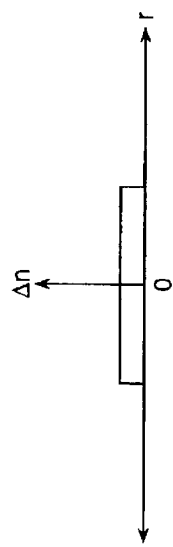
Figure 1C:
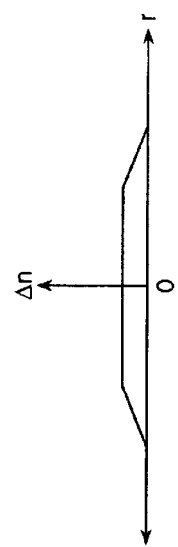
Figure 1D:
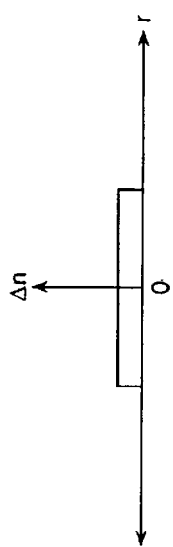

In a conventional VCL the index profile is a monotonically decreasing function of radius. Different current confinement and or optical confinement schemes lead to different profiles. FIGS. 1(a–d) graphically illustrate a variety of common index profiles. FIG. 1a illustrates the index profile that may result from thermal lensing. In operation, the index profile due to the thermal lens is added to index profile created by the optical or electrical apertures, as illustrated in FIGS. 1b, 1c, and 1d, when the device is operated above threshold.

Figure 2:
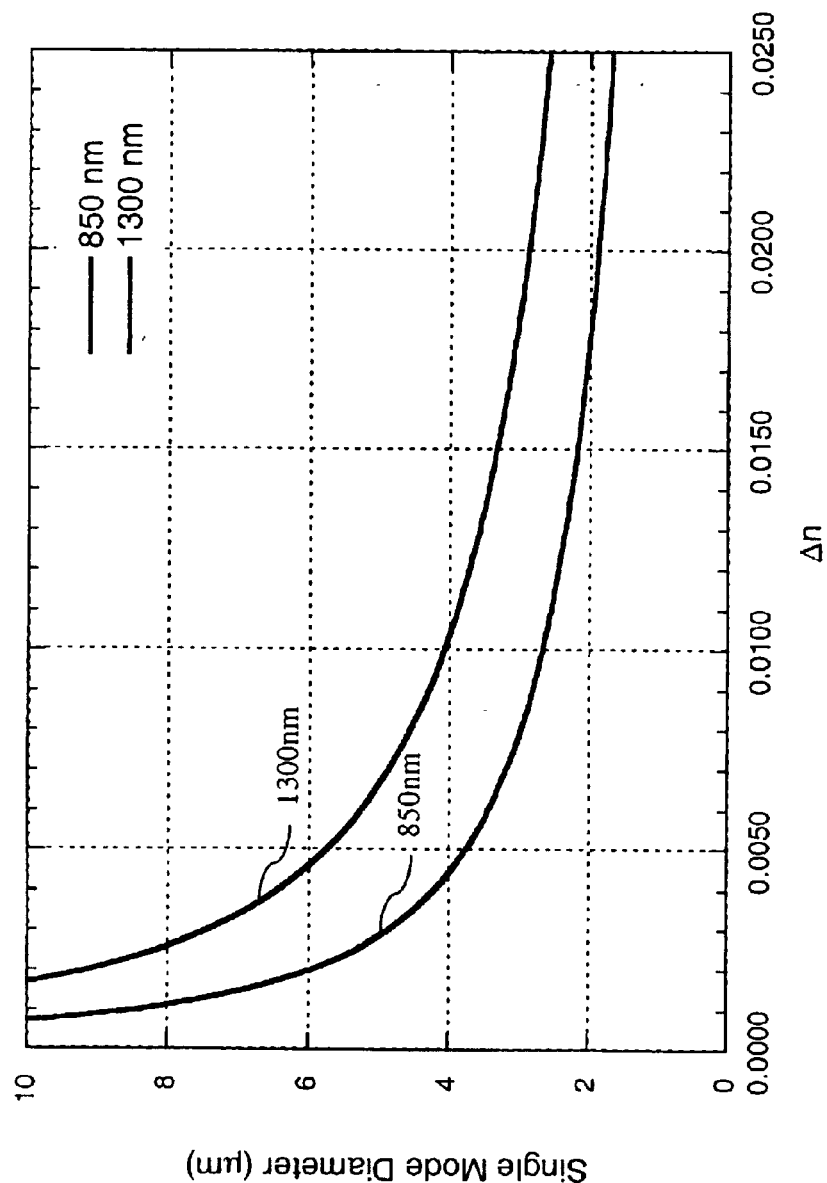
FIG. 2 graphically illustrates the single mode cutoff diameter as a function of index step for lasing wavelengths of 850 nm and 1300 nm.

For a step function index profile (e.g. generated by an abrupt oxide aperture) the single mode cutoff diameter is shown in FIG. 2. As an example, for the case of a laser with a thin oxide aperture placed at an optical node, where $|\Delta n|=0.008$, the single mode cutoff diameter is 3 $\mu$m at 850 nm and 4.5 $\mu$m at 1310 nm. For a multiple step or non-step-like index profiles the effective index step is an average of the index profile, weighted by the optical mode profile. The single mode cutoff for such cases must be calculated numerically.

Figure 3:
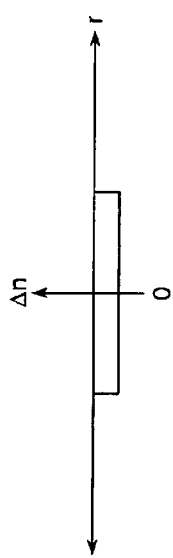
FIG. 3 graphically illustrates the sub-threshold index profile of a radially symmetric antiguide.

When the wave equation is separable into longitudinal and transverse solutions, Hadley[1] showed that, for the transverse mode, $$\frac{\Delta n_{eff}}{n_{eff}} = \frac{\Delta \lambda}{\lambda}. \quad \text{(Eq. 2)}$$

where $n_{eff}$ is the longitudinal effective index and $\lambda$ is the longitudinal resonant wavelength. Thus, by modifying the wavelength of the cavity in the lateral direction, it is possible to create an effective index difference between the core and cladding. In the above equation $\Delta n_{eff}$ is the effective index step from the core to the cladding and is give as $\Delta n_{eff} = n_{cladding} - n_{core}$. Similarly $\Delta \lambda = \lambda_{cladding} - \lambda_{core}$. The sign of the effective index step may be negative, which produces a waveguide, or positive, which produces an antiguide. The index profile of an antiguide is illustrated in FIG. 3. In the case of a waveguide, light is concentrated in the core. In the case of an antiguide, light generated in the core leaks away into the surrounding cladding.

[1]. G. R. Hadley, "Effective Index Model for Vertical Cavity Surface-Emitting Lasers," *Optics Lett.*, vol. 20, pp. 1483–1485, 1995.

One of skill in the art will appreciate that index profiles produced by different mechanisms sum to produce the total index profile. Therefore in an exemplary embodiment of the present invention a negative index step may be used to cancel a positive index step. More specifically, an effective index antiguide may be used to reduce, balance, or reverse the index step created by a current and/or optical aperture.

Figure 4A:
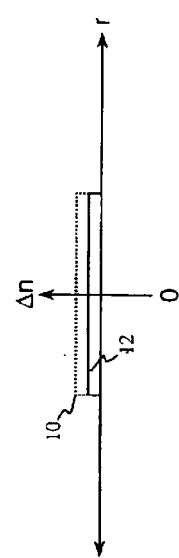
FIGS. 4(a–c) graphically illustrate the sub-threshold index profile of an abrupt oxide aperture combined with an effective index antiguide of the same size but of various strengths: a) weak antiguide, b) equal antiguide, and c) strong antiguide. In each case the original index profile is represented by the dotted line, while the solid line represents the combined index profile.
Figure 4B:
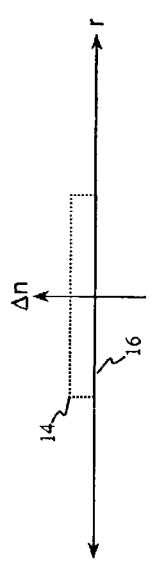
Figure 4C:
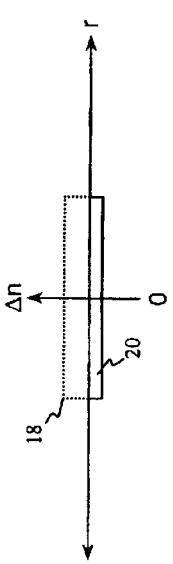

For example, FIGS. 4(*a–c*) graphically illustrate the interaction of an antiguide with waveguides produced by an abrupt oxide aperture as illustrated in FIG. 1(*b*). With a relatively-weak antiguide 10 the resulting index profile 12 may become a slightly weaker waveguide, as illustrated FIG. 4(*a*). If the magnitude of the antiguide 14 matches the magnitude of the guide, the index profile 16 may become perfectly flat, as illustrated in FIG. 4(*b*). Similarly, if the magnitude of the antiguide 18 is larger than the magnitude of the guide, the resulting profile 20 will be antiguiding, as in FIG. 4(*c*). Since, in this last case, the total index profile does not monotonically decrease as a function of radius, an exemplary VCL may include a second aperture, preferably larger in radius than the first, to provide mode control.

Figure 5A:
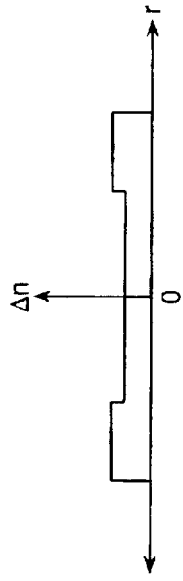
FIGS. 5(a–c) graphically illustrate the possible combined sub-threshold index profiles of first (smaller) and second (larger) apertures: a) weak antiguide, b) equal antiguide, and c) strong antiguide.
Figure 5B:
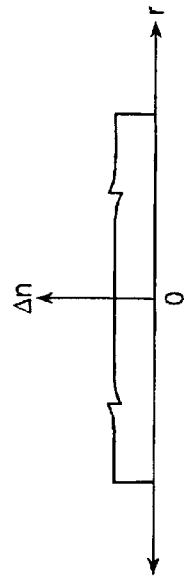
Figure 5C:
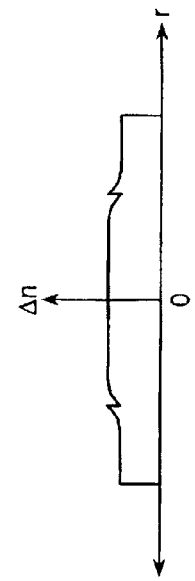
Figure 6:
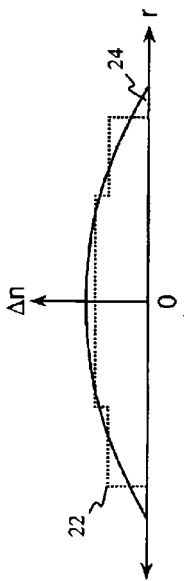
FIG. 6 graphically illustrates the ideal single mode waveguide parabolic index profile (solid line) with the superimposed index profile of FIG. 5(a) (dotted line)

Because it provides the lowest loss and greatest mode-selectivity, the index profile of a single mode waveguide is preferably parabolic. Therefore, effective index profiles that more closely approximate a parabola may provide a performance advantage in a VCL. FIGS. 5(*a–c*) graphically illustrates possible dual-aperture, antiguide VCL index profiles (assuming all elements provide step-like index grades). The profile may range from monotonically decreasing with radius, as in FIG. 5(*a*), to a non-monotonic function of radius, as FIG. 5(*c*). However, the index profile 22 of FIG. 5(*a*) most closely approximates the parabolic index profile 24, as illustrated in FIG. 6.

Figure 7A:
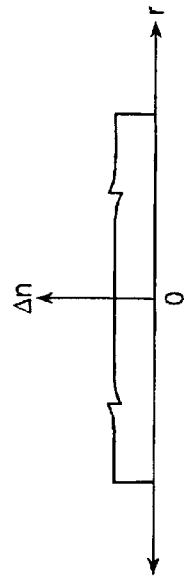
FIGS. 7(a–c) graphically illustrates the index profile of an antiguide VCL under increasing levels of bias: a) below threshold, b) at threshold, and c) at operating bias.
Figure 7B:
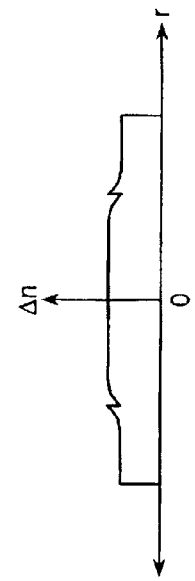
Figure 7C:
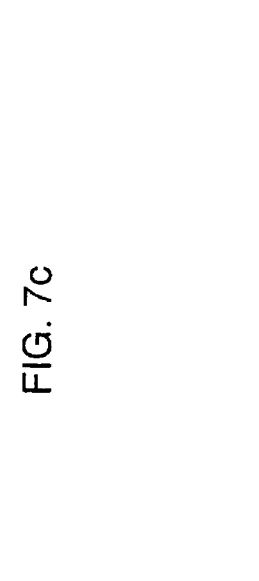

Above threshold the thermal lens may change the index profile as a function of bias current. The index profile of an exemplary antiguide VCL accounts for the effects of thermal lensing. FIGS. 7(*a–c*) provide an illustrative example of the change in index profile with increasing bias levels. Initially, the index profile of an exemplary VCL may be slightly antiguiding near the center, as illustrated in FIG. 7(*a*). As the bias is increased, the thermal lens changes the total index profile so that it is nearly flat in the center, as illustrated in FIG. 7(*b*). Finally, at the operating point, the thermal lens changes the total index profile so that it is approximately parabolic, as illustrated in FIG. 7(*c*). Advantageously, the change in the total index profile, from slightly antiguiding in the center to approximately parabolic, may improve the linearity of the VCL light-current characteristic.

A plurality of techniques may be utilized to form an effective antiguide. For example, an antiguide may comprise a recess or other perturbation formed in a semiconductor or hybrid cavity or in a semiconductor, dielectric or hybrid mirror. A hybrid cavity is one in which the optical cavity is composed of two or more materials, such as semiconductor and dielectric, with the interface(s) between materials located at optical null(s). A hybrid mirror may comprise a distributed Bragg reflector composed of two or more types of materials, such as semiconductor, dielectric or metal.

Figure 8B:
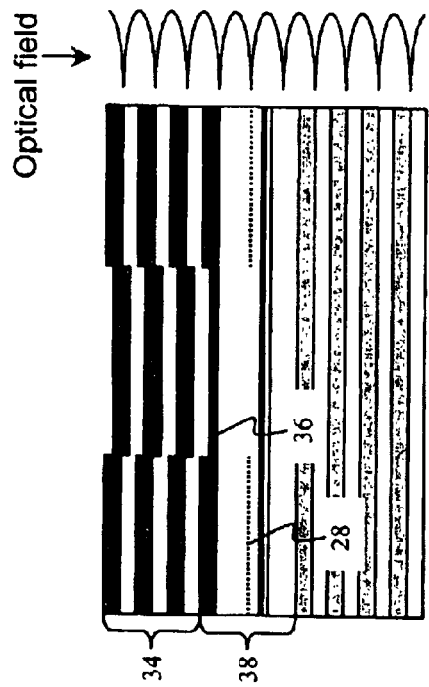
FIGS. 8(a–b) are cross-sectional views of a vertical cavity laser having an intra-cavity perturbation forming an antiguide that balances or reverses an index step formed by a current and/or optical aperture. The perturbation may be formed in a) a semiconductor optical cavity or b) a hybrid optical cavity.
Figure 8A:
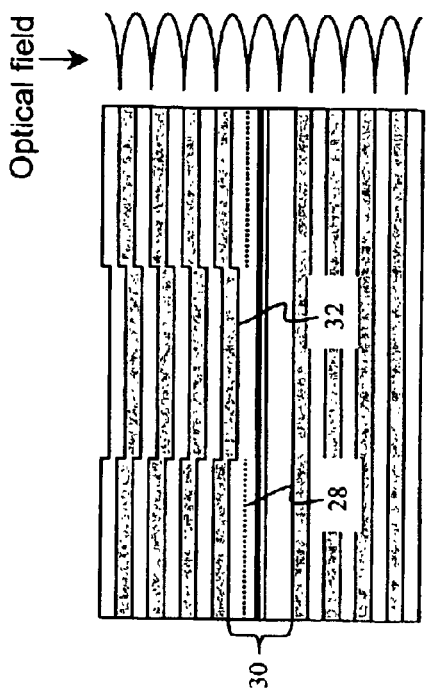

FIGS. 8(*a–b*) are cross-sectional views of exemplary VCLs having an antiguide formed within an optical cavity. An exemplary VCL with an oxide aperture 28 formed within the optical cavity may provide about $\Delta n_{eff} = -0.010$ of index guiding. At the operating point of such a device thermal lensing may provide approximately $\Delta n_{eff} = -0.020$ of additional index guiding for a total of about $\Delta n_{eff} = -0.030$ of index guiding. For purposes of illustration an antiguide on the order of about $\Delta n_{eff} = 0.020$ may be used to partially compensate this waveguide.

According to Hadley's equation, as set forth in Eq. 2 above, a core-cladding wavelength difference on the order of about $\Delta \lambda = -5.7$ nm will control the transverse modes of the illustrative oxide aperture VCL. In this instance, the core wavelength is larger than the cladding wavelength so as to produce a negative index step from core to cladding.

Referring to FIG. 8(*b*), the resonant wavelength difference may also be provided by a perturbation 36 in a hybrid optical cavity 38. Once again, a thickness variation 36 of about −5.7 nm may be introduced within the optical cavity 38 to provide the desired wavelength shift.

Figure 9A:
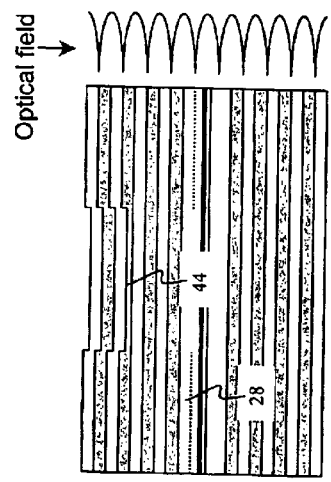
FIGS. 9(a–c) are cross-sectional views of exemplary vertical cavity lasers having an intra-mirror perturbation forming an antiguide that balances or reverses an index step formed by a current and/or optical aperture. An intra-mirror perturbation may be formed a) at the interface between the cavity and the mirror, b) somewhere in the middle of the mirror, or c) at the upper surface of the mirror.
Figure 9B:
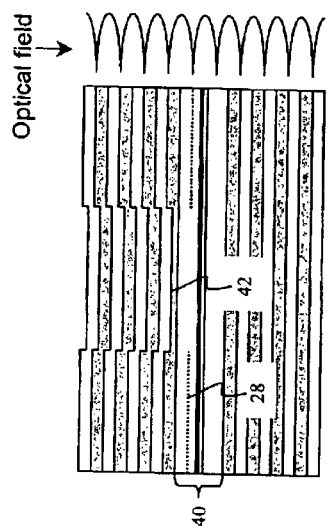
Figure 9C:
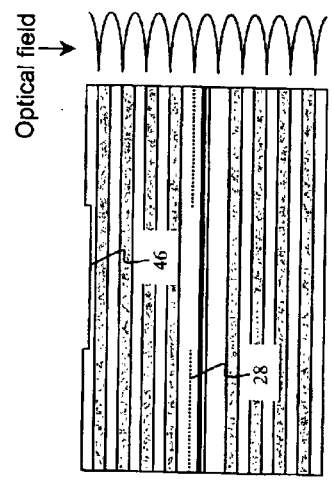
Figure 10A:
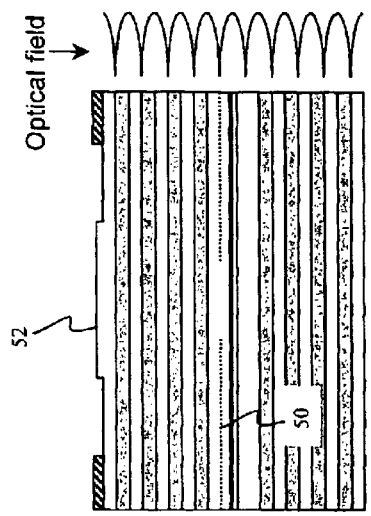
FIGS. 10(a–d) are cross-sectional views of exemplary vertical cavity lasers having a semiconductor, dielectric or hybrid intra-mirror perturbation forming a waveguide that circumscribes a first current and/or optical aperture. In accordance with an exemplary embodiment the perturbation may be formed a) at the upper surface of a semiconductor mirror, b) at the bottom of a dielectric mirror, c) at the metamorphic interface of a hybrid mirror, or d) at the upper surface of a hybrid mirror.
Figure 10B:
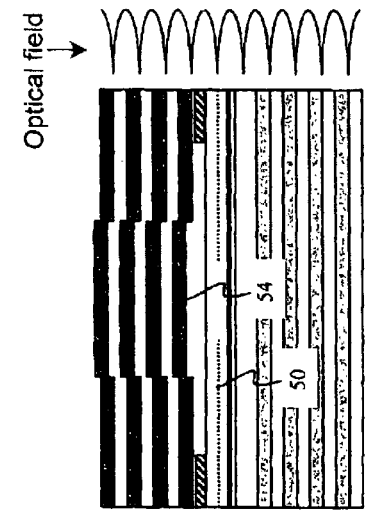
Figure 10C:
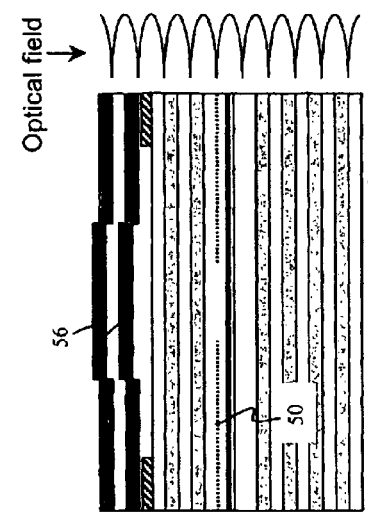
Figure 10D:
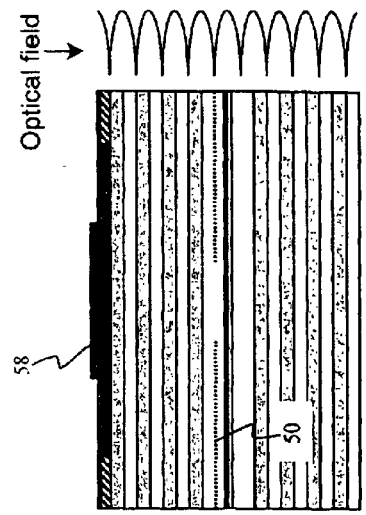

FIGS. 9(*a–c*) are cross-sectional views of exemplary vertical cavity lasers having an intra-mirror perturbation forming an antiguide that balances or reverses an index step formed by the current and/or optical aperture 28 formed in an optical cavity 40. The mirror may be formed from semiconductor material, dielectric material, or a combination of the two (hybrid).

In addition an exemplary intra-mirror perturbation may be formed at the interface 42 between the cavity and the mirror, as illustrated in FIG. 9(*a*), somewhere in the middle of the mirror 44, as illustrated in FIG. 9(*b*), or at the upper surface of the mirror 46, as illustrated in FIG. 9(*c*). However, the amplitude of the perturbation required to achieve the same degree of index or loss modulation increases with increasing distance between the perturbation and optical cavity. In this case $\Delta n_{eff}$ must be determined from the numerically calculated resonant wavelengths of both core and cladding.

One of skill in the art will appreciate that the addition or subtraction of an integral number of half wavelengths to a given perturbation produces the same resonant cavity offset. Thus, a recess may be changed to a protrusion and vice versa, without changing the functionality of the antiguide.

In accordance with an exemplary embodiment, the intra-mirror perturbation may be formed by photolithography and wet or dry etch techniques. Epitaxial growth may then be used to complete the mirror if the intra-mirror perturbation is formed at the bottom or in the middle of the semiconductor mirror. In an exemplary embodiment, the antiguiding intra-mirror perturbation may be formed in a dielectric or hybrid mirror, which may be fabricated by standard planar processing techniques.

A variety of methods, including loss modulation and index modulation, may be used to form a second mode control aperture. Loss modulation techniques laterally tailor the imaginary part of the refractive index so as to provide less loss for the fundamental mode with respect to higher order modes. An exemplary VCL may utilize a variety of loss modulation methods such as, for example, anti-phasing of a mirror to increase transmission losses for higher order modes. Similarly, an exemplary VCL having loss modulation may comprise a contoured mirror to increase reflectivity for the fundamental mode or decrease reflectivity for higher order modes. Alternatively, an exemplary VCL having loss modulation may comprise a mirror with selective mirror doping to increase absorption losses for higher order modes. Further, extended cavity VCLs may also be utilized to increase diffraction losses for higher order modes, although this technique produces loss primarily from the smaller aperture.

Index modulation techniques laterally tailor the real part of the refractive index so as to form a waveguide. Exemplary index modulated VCLs may be formed by lateral regrowth of lower index material, or by the formation of an oxide aperture. In addition, an index modulated VCL may utilize effective index guiding via resonant cavity wavelength modulation, as previously discussed. The waveguide in the described exemplary index guided VCLs may be formed from a high index region (core) surrounded by a region having a lower index (cladding).

"FIGS. 10(a–d) are cross-sectional view of exemplary vertical cavity lasers having a semiconductor, dielectric or hybrid intra-mirror perturbation forming a waveguide that circumscribes current and/or optical aperture 50. In accordance with an exemplary embodiment the perturbation may be formed at the upper surface 52 of a semiconductor mirror, as illustrated in FIG. 10(a). Alternatively, the intra-mirror perturbation may be formed at the bottom of a dielectric mirror 54, as illustrate in FIG. 10(b). The intra-mirror perturbation may also be formed at the metamorphic interface 56 of a hybrid mirror, as illustrated in FIG. 10(c) or at the upper surface 58 of a hybrid mirror, as illustrated in FIG. 10(d). However, the amplitude of the perturbation required to achieve the same degree of index or loss modulation increases with increasing distance between the perturbation and the optical cavity. If the perturbation is formed at the bottom or in the middle of a semiconductor mirror, epitaxial regrowth may be used to complete the mirror".

In an exemplary embodiment of the present invention, the relative reflectivity of the mirror surrounding the perturbation may be varied to provide loss modulation in addition to the effective index guiding resulting from the lateral modulation of the resonant cavity wavelength. Transmission loss in the cladding increases as $\Delta\lambda$ increases. Therefore, variation of the $\lambda_{cladding}$ may be used to provide additional mode discrimination. In an exemplary embodiment the waveguide perturbation may be formed close to the active layer in a dielectric or hybrid mirror, which may be fabricated by standard planar processing techniques FIGS. 11(a–d) are cross-sectional views of exemplary vertical cavity lasers have a second oxide aperture 62 forming a waveguide that circumscribes a first oxide (current and/or optical) aperture 60. The second oxide aperture 62 may be formed within the optical cavity 64 or within an upper mirror 66. In an exemplary embodiment, the second oxidation layer may be composed of a layer with a lower Al content than the first oxide aperture, so as to reduce its lateral oxidation rate. The mirror may be composed semiconductor material, dielectric material, or a combination of the two (hybrid). However, the oxide aperture layer 62 is usually located within the semiconductor portion of the mirror.

Figure 11B:
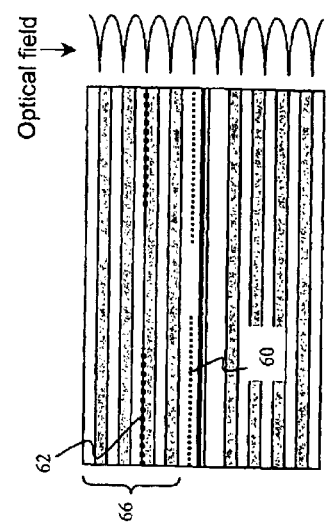
FIGS. 11(a–d) are a cross-sectional views of vertical cavity lasers having a second oxide aperture (denoted by a thick dotted line) forming a waveguide that circumscribes a first current and/or optical aperture (denoted by a thin dotted line). The oxide aperture may be formed a) at the bottom of the mirror, b) somewhere in the middle of the mirror, c) at the surface of the mirror, or d) at another point within the optical cavity.
Figure 11D:
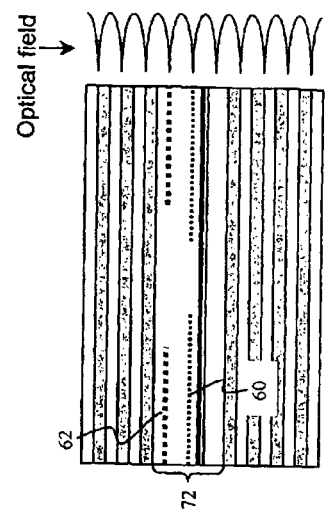
Figure 11A:
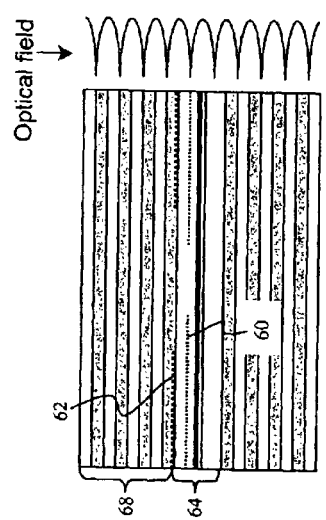
Figure 11C:
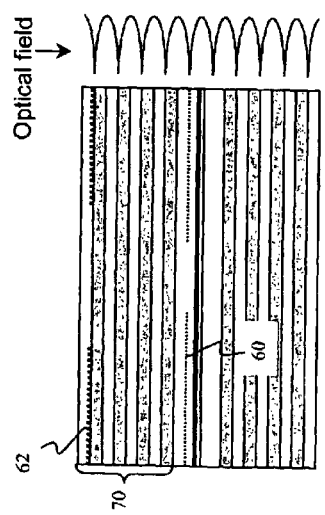

For example, FIG. 11(a) illustrates an exemplary VCL having a second oxide aperture 62 formed at the bottom of the upper mirror 68. FIG. 11(b) illustrates an exemplary VCL having a second oxide aperture 62 formed in the middle of the upper mirror 66. Similarly, FIG. 11(c) illustrates an exemplary VCL having a second oxide aperture 62 formed at the top of the upper mirror 70. However, the greater the distance from the cavity to the oxide aperture, the greater the thickness of the oxide aperture required to achieve the same degree of index modulation. Alternatively, the oxide aperture may be moved from an optical standing wave null to a peak, or vice versa, thus modulating the degree of index guiding.

FIG. 11(d) is a cross-sectional view of an exemplary VCL having a second oxide aperture 62 formed at another point within the optical cavity 72. In an exemplary embodiment, the first and second oxide apertures may be formed by the steam oxidation of an Al-containing semiconductor layer. In the described exemplary embodiment, the second oxidation layer 62 may comprise a semiconductor layer with a lower Al content than the first aperture, so as to reduce its lateral oxidation rate relative to the oxidation rate of the first aperture. The location of the second aperture, whether above or below the active region, or whether at an optical peak or null, depends on the desired strength of the waveguide as well as processing considerations.

Figure 12A:
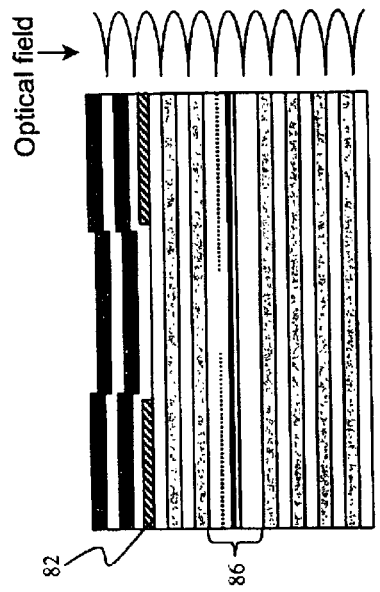
FIGS. 12(a–c) are a cross-sectional views of vertical cavity lasers having an anti-phased metal aperture, which provides index and/or loss modulation, and that circumscribes a first current and/or optical aperture (denoted by a thin dotted line). The oxide aperture may be formed at a) the bottom of the mirror, b) somewhere in the middle of the mirror, or c) at the surface of the mirror.
Figure 12B:
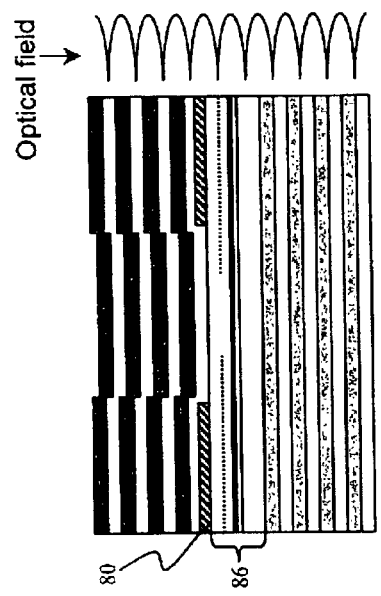
Figure 12C:
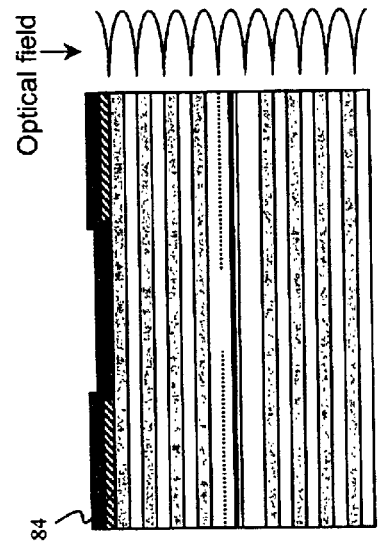

A secondary loss or index modulation may also be formed via an intra-cavity or intra-mirror metal aperture as illustrated in FIGS. 12(a–c). The mirror may be composed of semiconductor material, dielectric material, or a combination of the two (hybrid). The metal aperture may be formed at the bottom of the mirror (see FIG. 12(a)), somewhere within the mirror (see FIG. 12(b)) or at the top of the mirror (see FIG. 12(c)).

In an exemplary structure the reflection of the metal layer may be in phase with the underlying mirror layers. In this instance pure index modulation may be achieved by matching the reflectivity of the mirror within the aperture with the reflectivity of the mirror capped with metal. In an alternate VCL the reflection of the metal layer may be out of phase with the underlying mirror layers so that loss modulation may be achieved. The greater the distance from the cavity to the metal aperture, the greater the relative anti-phasing of the metal layer is required to achieve the same degree of loss modulation. In an exemplary embodiment the anti-phased metal 80 and 82 is formed near the cavity 86 of a VCL, as illustrated in FIGS. 12(a) and 12b, respectively, so that loss modulation may be more readily achieved.

In order to appreciate the advantages of the present invention, it will be beneficial to describe the invention in the context of several exemplary vertical cavity laser structures. The material composition of an exemplary antiguide VCL may be some combination of group III-V or II-VI compound semiconductor materials, such as GaAs/AlGaAs, InGaAs/AlGaAs or InP/InGaAsP. However, other direct bandgap semiconductor materials may also be used.

In an exemplary embodiment the VCL body can be formed from a semiconductor homostructure, single heterostructure, double heterostructure or multi-heterostructure. All such structures include an active light-emitting region near a p-n junction in the body. The active region may be composed of quantum dots, a single quantum well, multiple quantum wells or a bulk active layer.

A conventional VCL portion of an exemplary embodiment of the present invention is disclosed in commonly owned U.S. patent application Ser. No. 09/237,580, the content of which is incorporated herein by reference as if set forth in full. An exemplary VCL structure may comprise a substrate, a lower mirror, an optical cavity and an upper mirror. As is commonly known in the art, the substrate may be made of gallium arsenide (GaAs) or any other suitable material. The lower mirror, in accordance with an exemplary embodiment of the present invention, may comprise a multi-layered distributed Bragg reflector (DBR), as is conventional in the art. An exemplary embodiment of the present invention may include a semiconductor upper mirror, a dielectric upper mirror or a hybrid upper mirror having semiconductor mirror layers and dielectric mirror layers.

In an exemplary embodiment, aluminum gallium arsenide (AlGaAs) and aluminum arsenide (AlAs), with varying concentrations of aluminum and gallium may be used to fabricate the lower mirror and the semiconductor mirror layers within the upper mirror. The upper and lower semiconductor mirror layers are preferably doped of opposite conductivity types. The optical thickness of each mirror layer is typically designed to be a quarter wavelength of the emitted light of the laser where the optical thickness is given by the product of the physical thickness and the index of refraction.

Figure 13:
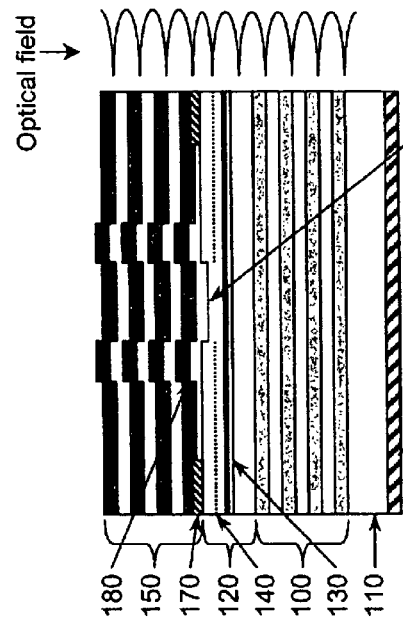
FIG. 13 is a cross-sectional view of a vertical cavity laser with a monolithic semiconductor cavity having an intra-cavity perturbation forming an antiguide that balances or reverses an index step formed by an oxide aperture in the optical cavity and a second, intra-mirror perturbation circumscribing the first that forms an optical aperture to confine the optical mode in accordance with an exemplary embodiment of the present invention.

Referring to FIG. 13, in a first embodiment a lower n-type or undoped mirror 100 is epitaxially grown on a semiconductor substrate 110. An optical cavity 120 having one or more quantum wells 130 is then formed adjacent to the lower mirror. In this embodiment a first oxide or implant current aperture 140 may be formed in the optical cavity 120. In this and other embodiments like reference numerals may be used to refer to like elements.

An upper dielectric mirror 150 may be formed adjacent the optical cavity 120 wherein the dielectric mirror layers are of constant thickness but match the lateral contours of the upper surface of the optical cavity. The dielectric mirror pairs may be formed from alternating low and high index of refraction layers. For example, in an exemplary embodiment the dielectric upper mirror may be formed by alternating depositions of ¼λ silicon dioxide and ¼λ silicon nitride, where the total number of dielectric mirror periods satisfies the VCL requirements for reflectivity as is known in the art. The dielectric mirrors may be formed by a variety of known techniques; such as for example, by patterned liftoff of appropriate combinations of zinc selenide, cadmium fluoride, titanium oxide or silicon dioxide as is known in the art.

In the described exemplary embodiment the optical cavity may have an optical thickness equal to the wavelength of the light emitted within the cavity. In an exemplary embodiment a recess 160, in the range of about 5–7 nm deep, may be etched into the uppermost surface of the optical cavity. In one embodiment the cavity may be selectively etched using photolithography and wet or dry etch techniques prior to the deposition of the upper dielectric mirror.

In operation, the recess 160 in the optical cavity 120 modifies the cavity wavelength in the lateral direction creating an effective transverse index step. The shift in the resonant cavity wavelength provides the antiguiding necessary to mitigate, balance or reverse the waveguide produced between the un-oxidized core and the oxidized cladding.

If the current aperture is comprised of an oxide aperture, then the oxidation layer may be formed from a semiconductor alloy containing aluminum. For example, the oxide aperture layers may be formed from AlAs or from AlGaAs with an aluminum composition higher than the aluminum composition of any of the layers of the optical cavity. The semiconductor alloy may be oxidized in part after a mesa is formed in the VCL structure. The oxidized cladding layer has increased resistivity providing lateral current constriction. In accordance with an exemplary embodiment, both the core and cladding areas remain substantially transmissive to light.

In an exemplary embodiment of the present invention the mesa may be formed by etching down, at least to the lower oxide aperture, by a wet or a dry etching process such as reactive ion etching (RIE), reactive ion beam etching (RIBE), or the like. The mesa may be formed by lithographically patterning the top surface of the upper mirror 150 and depositing thereon a suitable material (for example, silicon nitride, silicon oxide, silicon oxynitride, metal silicides, or refractory metals) as an etch mask. After etching the mesa structure down to or through the oxide aperture 140, the etch mask may be left in place to protect the top layer of the upper mirror, or removed prior to the oxidation process.

In forming the mesa, the etch depth may be measured in-situ by reflectometry to provide a precise control of the etch depth, and to allow the etch process to be stopped after etching down at least to the lower oxide aperture. In some instances, it may be preferable to etch down beyond the lower oxide aperture to provide more-vertical sidewalls for the mesa for uniform oxidation of one or more oxide apertures.

The oxidation process may be carried out by placing the wafer into a container and heating the wafer to a temperature in the range of 350 to 500 C under a controlled environment having a high humidity. For example, a suitable environment may be generated, by flowing a gas, such as nitrogen, through water heated to about 80–95 C to entrain water vapor, and then directing the moisture-laden gas into the container.

In the described exemplary embodiment, a top ohmic contact 170 may be formed on the upper cavity surface. If the top contact material is p-type, the ohmic contact may be, for example, gold with 2% beryllium added or a layered structure of titanium/platinum/gold, preferably deposited by electron beam evaporation A bottom ohmic contact 172 may be formed below the substrate 110 in the case of a conducting bottom mirror and substrate, or within the n-type portion of the cavity in the case of an undoped bottom mirror and semi-insulating substrate. If the bottom ohmic contact is n-type, the ohmic contact may be, for example, eutectic gold germanium deposited by electron beam evaporation or sputtering. The polarity of top and bottom contacts may be reversed for processing or performance reasons.

The described exemplary embodiment may include a second aperture, larger than the first oxide aperture, to provide optical confinement. In this embodiment an intra-mirror perturbation comprises a variation in the thickness of the first dielectric layer 180 of the upper mirror. In this embodiment the mirror perturbation may be in the range of about 5–7 nm thick. The mirror perturbation may be selectively patterned using photolithography and wet or dry etch techniques.

Figure 14:
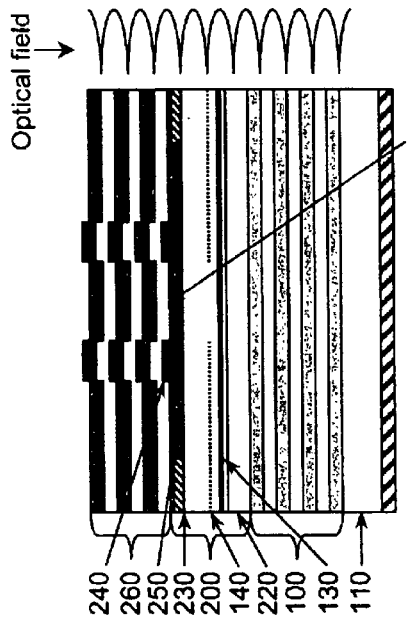
FIG. 14 is a cross-sectional view of a vertical cavity laser with a hybrid semiconductor/dielectric cavity having an intra-cavity perturbation forming an antiguide that balances or reverses an index step formed by an oxide aperture in the optical cavity and a second, intra-cavity perturbation circumscribing the first that forms an optical aperture to confine the optical mode in accordance with an exemplary embodiment of the present invention.

Referring to FIG. 14, another embodiment of the present invention may comprise a VCL having a hybrid cavity 200 with a dielectric extension 250 wherein the thickness of the dielectric cavity extension is spatially varied 210. The dielectric extension 250 may be formed from optically passive materials such as for example, silicon dioxide, air or a hybrid of materials. The spatial variation 210 in the dielectric extension 250 again forms an antiguide that balances or reverses the waveguide induced by the un-oxidized core and the oxidized cladding.

In this embodiment, the semiconductor portion 220 of the optical cavity is ⅝λ thick and the interface 230 between the semiconductor portion and the dielectric portion is located at a null in the optical standing wave field. Advantageously, locating the interface 230 between the semiconductor portion and the dielectric portion of the optical cavity at a standing wave null reduces the scattering loss due to roughness or absorption loss due to impurities at the interface. In accordance with an exemplary embodiment the hybrid semiconductor-dielectric cavity may be fabricated with standard manufacturing techniques, such as for example photolithography and liftoff techniques for patterning dielectric layers.

In this embodiment a perturbation comprising a variation in the thickness 240 of the dielectric cavity extension 250 may be used to form the second waveguide. In the described exemplary embodiment, the thickness variation may be in the range of about 5–7 nm and is chosen to achieve the desired resonant cavity offset between the core and cladding. The thickness variation in the extension layer may be selectively patterned using photolithography and wet or dry etch techniques.

In this embodiment, the upper mirror 260 may again comprise a DBR formed from alternating low and high index of refraction dielectric layers. For example, in an exemplary embodiment the dielectric mirror pairs may be formed by alternating depositions of ¼λ silicon dioxide and ¼λ silicon nitride, where the total number of dielectric mirror periods satisfies the VCL requirements for reflectivity as is known in the art.

Figure 15:
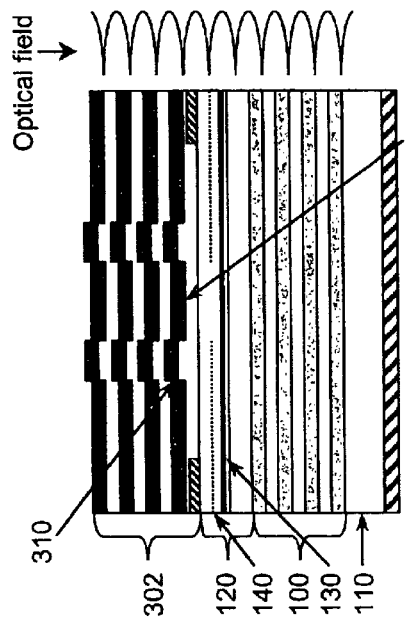
FIG. 15 is a cross-sectional view of a vertical cavity laser with a dielectric mirror having an intra-mirror perturbation forming an antiguide that balances or reverses an index step formed by an oxide aperture in the optical cavity and a second intra-mirror perturbation circumscribing the first that forms an optical aperture to confine the optical mode in accordance with an exemplary embodiment of the present invention.

Referring to FIG. 15, in another embodiment, the lower n-type or undoped mirror 100 may again be epitaxially grown on a substrate 110. The optical cavity 120, having one or more quantum wells 130, may then be formed adjacent the lower mirror with the optical cavity being an integral number of half optical wavelengths thick. In this embodiment, an oxide or implant current aperture 140 may be formed in the optical cavity.

The described exemplary embodiment may include a dielectric upper mirror 302 in which the thickness of the first mirror layer is spatially varied. The first mirror layer may be formed from optically passive materials such as for example, silicon dioxide, air or a hybrid of materials. In the described exemplary embodiment a recess 300 in the first mirror layer again forms an antiguide that balances or reverses the waveguide created between the un-oxidized core and oxidized cladding. The recess 300 may be formed by selectively depositing and/or etching dielectric layers using standard photolithography, deposition and etch techniques.

In this embodiment a perturbation comprising an increase in the thickness 310 of the first layer of the upper mirror may be used to form the second waveguide. The thickness increase may be in the range of about 5–7 nm and is chosen to achieve the desired resonant cavity offset between the core and cladding regions. The thickness increase 310 in the first layer of the upper mirror may be selectively patterned using photolithography and wet or dry etch techniques.

In this embodiment, dielectric mirror layers may again be used to form the upper mirror of the VCL. The dielectric mirror pairs may be formed by alternating depositions of ¼λ silicon dioxide and ¼λ silicon nitride, where the total number of dielectric mirror periods satisfies the VCL requirements for reflectivity as is known in the art.

Figure 16:
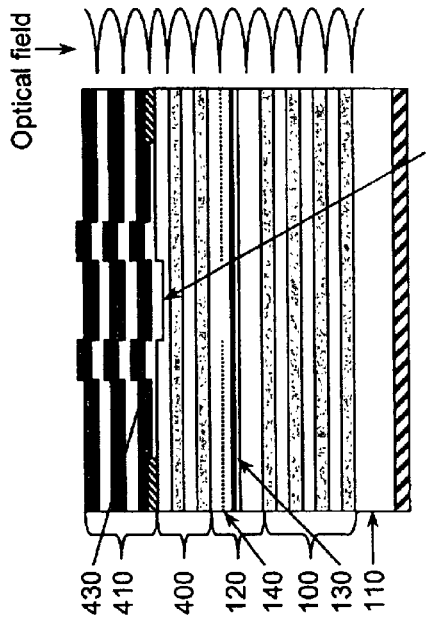
FIG. 16 is a cross-sectional view of a vertical cavity laser with a hybrid semiconductor/dielectric mirror having an intra-mirror perturbation, formed at the surface of the semiconductor portion of the mirror, which forms an antiguide that balances or reverses an index step formed by an oxide aperture in the optical cavity and a second intra-mirror perturbation, formed within the dielectric portion of the mirror, which circumscribes the first that forms an optical aperture to confine the optical mode in accordance with an exemplary embodiment of the present invention.

In another embodiment, referring to FIG. 16, the lower n-type or undoped mirror 100 may again be epitaxially grown on the substrate 110. The optical cavity 120, having one or more quantum wells 130, may be formed on the lower mirror. In an exemplary embodiment the optical cavity may be an integral number of half optical wavelengths thick. In this embodiment a first oxide or implant current aperture 140 may again be formed in the optical cavity 120. In this embodiment a hybrid upper mirror having a p-type semiconductor portion 400 and a dielectric portion 410 may be formed above the optical cavity.

In this embodiment the p-type semiconductor portion 400 of the upper mirror has a recess 420 etched into its uppermost surface. The mirror may be selectively etched using photolithography and wet or dry etch techniques. The recess in the mirror surface modifies the cavity wavelength in the lateral direction creating an effective index step. The shift in the resonant cavity wavelength provides the antiguiding necessary to mitigate, balance or reverse the waveguide created between the un-oxidized core and oxidized cladding.

In this embodiment a perturbation comprising a variation in the thickness 430 of the first dielectric layer of the dielectric portion 410 of the upper mirror may be used to form the second waveguide. The thickness variation may be chosen to achieve the desired resonant cavity offset between the un-oxidized core and the oxidized cladding. The thickness variation 430 in the first dielectric layer may be selectively patterned using photolithography and wet or dry etch techniques. In the described exemplary embodiment the shift in the resonant cavity wavelength provides the effective index step necessary to produce a single mode waveguide.

In this embodiment, the dielectric portion of the upper mirror may again comprise a dielectric DBR formed by alternating layers of low and high index of refraction dielectric. For example, in the described exemplary embodiment the dielectric mirror pairs may be formed by alternating depositions of ¼λ silicon dioxide and ¼λ silicon nitride, where the total number of semiconductor plus dielectric mirror periods satisfies the VCL requirements for reflectivity as is known in the art.

Referring to FIG. 17, in a further alternate embodiment the lower n-type or undoped mirror 100 may again be epitaxially grown on a GaAs substrate 110. The optical cavity 120, having one or more quantum wells 130, may then be formed adjacent the lower mirror with the optical cavity being an integral number of half optical wavelengths thick. In this embodiment a first oxide or implant current aperture 140 may again be formed in the optical cavity 120. The described exemplary embodiment may further comprise a hybrid upper mirror, having a p-type semiconductor portion 400 and a dielectric portion 410 formed above the optical cavity 120.

In the described exemplary embodiment the thickness of the first mirror layer of the dielectric portion of the upper mirror is spatially varied. The first mirror layer may be formed from optically passive materials such as for example, silicon dioxide, air or a hybrid of materials. The thickness variation of the first mirror layer (i.e. recess 500) again forms an antiguide that balances or reverses the waveguide created between the un-oxidized core and oxidized cladding. The recess may be formed by selectively depositing and/or etching dielectric layers using standard photolithography, deposition and etch techniques.

In this embodiment an intra-mirror perturbation comprising an increase in the thickness 430 of the first dielectric layer may be used to form the second waveguide. The thickness increase may be chosen to achieve the desired resonant cavity offset between the core and cladding. The thickness increase may be selectively patterned using photolithography and wet or dry etch techniques. The shift in the resonant cavity wavelength provides the effective index step necessary to produce a single mode waveguide.

In this embodiment, dielectric mirror layers may again be used to form the upper mirror of the VCL. The dielectric mirror pairs are formed by alternating depositions of ¼λ silicon dioxide and ¼λ silicon nitride, where the total number of semiconductor plus dielectric mirror periods satisfies the VCL requirements for reflectivity as is known in the art.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. For example, the present invention may be practiced with any of a variety of Group III-V or Group II-VI material systems that are designed to emit at any of a variety of wavelengths. Further, the present invention is not limited to a particular VCL structure. Rather the present invention may be utilized in a variety of VCL structures including devices having upper and/or lower intra-cavity contacts, as well as devices that emit through the substrate.

It is therefore desired that the present embodiments be considered in all respects as illustrative and not restrictive, reference being made to the appended claims rather than the foregoing description to indicate the scope of the invention.

What is claimed is:

1. A vertical cavity laser (VCL); comprising:
   an optical cavity adjacent a first mirror;
   a second mirror adjacent said optical cavity;
   a current constriction within said optical cavity for confining current, said current constriction providing a positive index step; and
   an antiguide configured and arranged above said current constriction, said antiguide creating a negative index step for balancing said positive index step created by said current constriction.

2. The vertical cavity laser of claim 1 further comprising an optical aperture for confining optical mode to provide single transverse mode operation.

3. The vertical cavity laser of claim 1 wherein said current constriction comprises an oxide aperture.

4. The vertical cavity laser of claim 1 wherein said current constriction comprises an ion implant.

5. The vertical cavity laser of claim 1 wherein said anti-guide comprises a perturbation in the optical cavity.

6. The vertical cavity laser of claim 1 wherein said anti-guide comprises a perturbation in the second mirror.

7. The vertical cavity laser of claim 6 wherein said second mirror comprises a plurality of dielectric mirror layers.

8. The vertical cavity laser of claim 7 wherein said perturbation comprises a first variation in thickness of at least one of said plurality of dielectric mirror layers.

9. The vertical cavity laser of claim 8 further comprising a second variation in thickness of at least one of said plurality of dielectric mirror layers, wherein said second variation in thickness forms an optical aperture for confining optical mode to provide single transverse mode operation.

10. The vertical cavity laser of claim 6 wherein said second mirror comprises a semiconductor mirror portion and a dielectric mirror portion.

11. The vertical cavity laser of claim 10 wherein said semiconductor mirror portion of said second mirror comprises a plurality of semiconductor mirror layers and wherein said perturbation comprises a first variation in thickness of at least one of said plurality of semiconductor mirror layers.

12. The vertical cavity laser of claim 11 wherein said dielectric mirror portion of said second mirror comprises a plurality of dielectric mirror layers wherein thickness of at least one of said plurality of dielectric mirror layers laterally varies for forming an optical aperture for confining optical mode to provide single transverse mode operation.

13. The vertical cavity laser of claim 10 wherein said dielectric mirror portion of said second mirror comprises a plurality of dielectric mirror layers and wherein said perturbation comprises a first variation in thickness of at least one of said plurality of dielectric mirror layers.

14. The vertical cavity laser of claim 13 further comprising a second variation in thickness of said at least one of said plurality of dielectric mirror layers, wherein said second variation in thickness forms an optical aperture for confining optical mode to provide single transverse node operation.

15. The vertical cavity laser of claim 1 further comprising a dielectric extension layer formed between said optical cavity and said second mirror layers, wherein said anti-guide comprises a perturbation formed in said dielectric extension layer.

16. The vertical cavity laser of claim 15 wherein said second mirror comprises a plurality of dielectric mirror layers and wherein thickness of at least one of said plurality of dielectric mirror layers spatially vines, forming an optical aperture for confining optical mode to provide single transverse mode operation.

17. A vertical cavity laser (VCL); comprising:
   a substrate;
   a first mirror adjacent said substrate;
   an optical cavity adjacent said first mirror;
   a second mirror adjacent said optical cavity;
   a current constriction formed within said optical cavity, said current constriction having a predetermined diameter, said current constriction creating a positive index step within said optical cavity; and
   an antiguide configured and arranged above said current constriction to create a negative index step, said negative index step at least partially balancing said positive index step created by said current constriction.

18. The vertical cavity laser of claim 17 further comprising an optical aperture adjacent said optical cavity, said optical aperture being configured and arranged to provide single transverse mode operation of said vertical cavity laser.

19. The vertical cavity laser of claim 18 wherein said optical aperture has a predetermined diameter which is larger than said predetermined diameter of said current constriction.

20. The vertical cavity laser of claim 17, wherein said and guide comprises a perturbation in the optical cavity.

21. The vertical cavity laser of claim 20 wherein said optical cavity comprise a plurality of layers, said perturbation comprising a variation in thickness of at least one of said plurality of layers.

22. The vertical cavity laser of claim 17, wherein said antiguide comprises a perturbation in the second mirror.

23. The vertical cavity laser of claim 22, wherein said second mirror comprises a plurality of mirror layers, said perturbation comprising a variation in thickness of at least one of said plurality of mirror layers.

* * * * *